United States Patent
Taniguchi et al.

(10) Patent No.: US 11,314,162 B2
(45) Date of Patent: Apr. 26, 2022

(54) MASK BLANK, TRANSFER MASK, AND METHOD OF MANUFACTURING SEMICONDUCTOR DEVICE

(71) Applicant: HOYA CORPORATION, Tokyo (JP)

(72) Inventors: Kazutake Taniguchi, Tokyo (JP); Hiroaki Shishido, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 436 days.

(21) Appl. No.: 16/492,904

(22) PCT Filed: Feb. 28, 2018

(86) PCT No.: PCT/JP2018/007475
§ 371 (c)(1),
(2) Date: Sep. 10, 2019

(87) PCT Pub. No.: WO2018/168464
PCT Pub. Date: Sep. 20, 2018

(65) Prior Publication Data
US 2021/0141305 A1  May 13, 2021

(30) Foreign Application Priority Data
Mar. 16, 2017 (JP) .............................. JP2017-051032

(51) Int. Cl.
*G03F 1/54* (2012.01)
*G03F 1/50* (2012.01)

(52) U.S. Cl.
CPC . *G03F 1/54* (2013.01); *G03F 1/50* (2013.01)

(58) Field of Classification Search
CPC ..................................... G03F 1/50; G03F 1/54
USPC ............................................................ 430/5
See application file for complete search history.

(56) References Cited

U.S. PATENT DOCUMENTS

| 5,629,115 A | 5/1997 | Kawano et al. |
| 10,481,486 B2 * | 11/2019 | Nozawa .................... G03F 1/54 |
| 2012/0082924 A1 | 4/2012 | Kominato et al. |
| 2012/0156596 A1 | 6/2012 | Kominato et al. |
| 2015/0338731 A1 | 11/2015 | Nozawa et al. |

FOREIGN PATENT DOCUMENTS

| JP | H07-159981 A | 6/1995 |
| JP | 2010-217514 A | 9/2010 |
| JP | 2012-078441 A | 4/2012 |
| JP | 2012-141583 A | 7/2012 |
| JP | 2013-065036 A | 4/2013 |
| JP | 2014-137388 A | 7/2014 |

OTHER PUBLICATIONS

PCT/JP2018/007475, English translation of International Search Report dated May 22, 2018, 2 pages.

* cited by examiner

*Primary Examiner* — Christopher G Young
(74) *Attorney, Agent, or Firm* — Kilpatrick Townsend & Stockton LLP

(57) ABSTRACT

Provided is a mask blank in which a light shielding film which is a single layer film formed of a silicon nitride-based material has high light shielding performance against ArF exposure light and is capable of reducing EMF bias of a pattern of the light shielding film. The mask blank includes the light shielding film on a transparent substrate. The light shielding film has an optical density of 3.0 or greater to ArF exposure light. A refractive index n and an extinction coefficient k of the light shielding film to ArF exposure light simultaneously satisfy relationships defined by Formulas (1) and (2) below.

$n \leq 0.0733 \times k^2 + 0.4069 \times k + 1.0083$   Formula (1)

$n \geq 29.316 \times k^2 - 92.292 \times k + 72.671$   Formula (2)

20 Claims, 4 Drawing Sheets

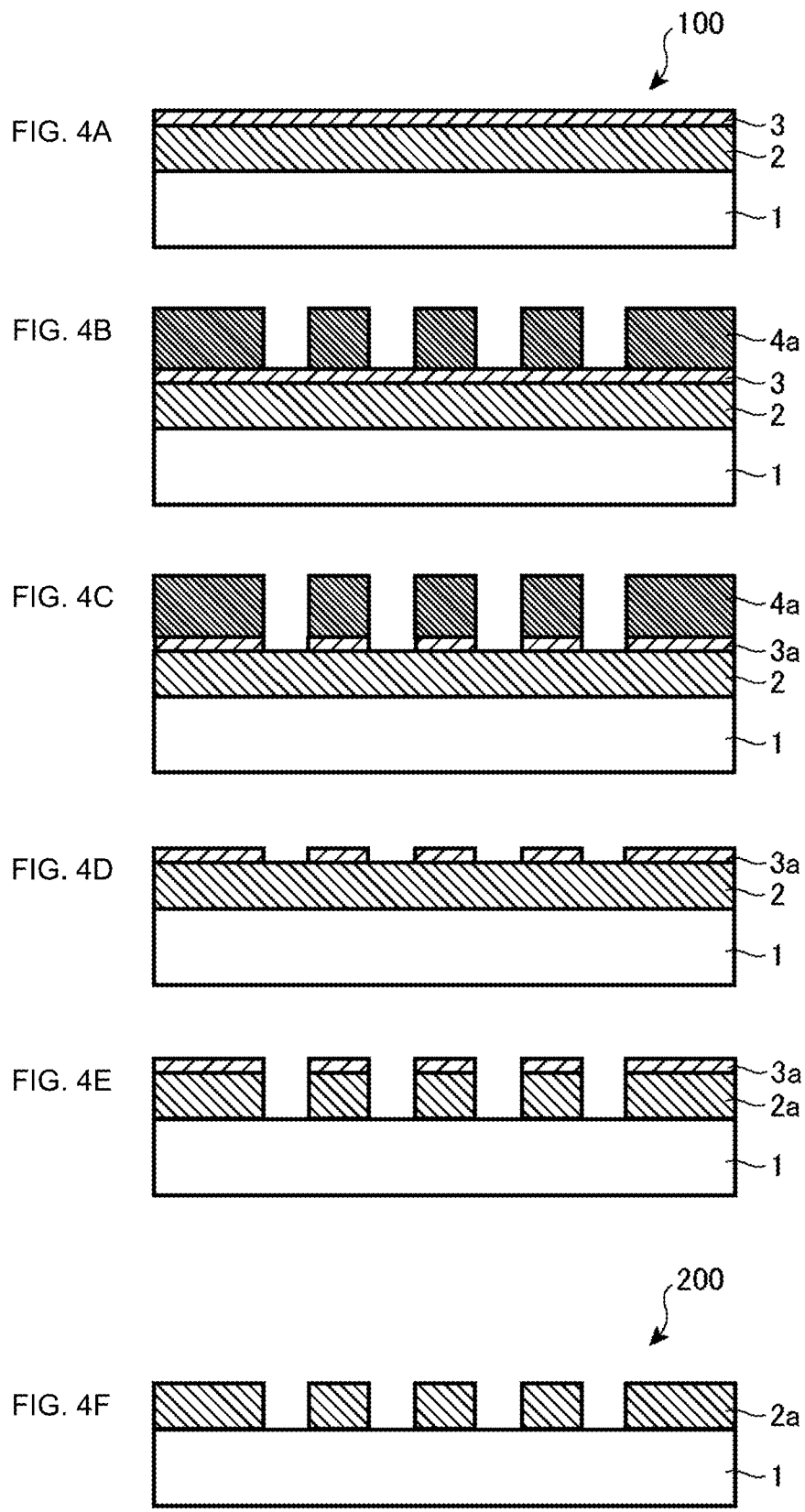

MASK BLANK, TRANSFER MASK, AND METHOD OF MANUFACTURING SEMICONDUCTOR DEVICE

CROSS REFERENCE TO RELATED APPLICATIONS

This application is the U.S. National Phase application of International Application No. PCT/JP2018/007475, filed Feb. 28, 2018, which claims priority to Japanese Application No. 2017-051032, filed Mar. 16, 2017, and the contents of which is hereby incorporated by reference herein in its entirety.

TECHNICAL FIELD

The present disclosure relates to a mask blank, a transfer mask manufactured by using the mask blank, and a method of manufacturing a semiconductor device by using the transfer mask.

BACKGROUND ART

Generally, at the steps of manufacturing a semiconductor device, photolithography is used to form fine patterns. Furthermore, many transfer masks are usually used in forming these fine patterns. To make a semiconductor device pattern finer, it is necessary not only to make a mask pattern formed in a transfer mask finer, but also to shorten a wavelength of an exposure light source used in photolithography. Regarding the exposure light source used in manufacturing a semiconductor device, the wavelength has been increasingly shortened from a KrF excimer laser (wavelength of 248 nm) to an ArF excimer laser (wavelength of 193 nm) in recent years.

One type of transfer mask is a half tone phase shift mask. For a phase shift film of the half tone phase shift mask, a molybdenum silicide (MoSi)-based material is widely used. However, as disclosed in Patent Document 1, a MoSi-based film has been recently found to have low fastness to ArF excimer laser exposure light (hereinafter referred to as ArF exposure light) (so-called ArF light fastness). In Patent Document 1, a MoSi-based film obtained after formation of a pattern is subjected to a plasma treatment, a UV irradiation treatment, or a heating treatment to form a passive film in a surface of a pattern of the MoSi-based film, and thus ArF light fastness is enhanced.

On the other hand, Patent Document 2 discloses a phase shift mask including a phase shift film made of SiN. Patent Document 3 describes that a phase shift film made of SiN is confirmed to have high ArF light fastness.

PRIOR ART PUBLICATIONS

Patent Publications

Patent Document 1: JP 2010-217514 A
Patent Document 2: JP H07-159981 A
Patent Document 3: JP 2014-137388 A

SUMMARY OF DISCLOSURE

Problem to be Solved by the Disclosure

Not only a phase shift mask but also a binary mask has a problem about ArF light fastness of a transfer mask. In recent years, a light shielding pattern of a binary mask has been made further finer. Since patterning is performed by dry etching using an etching gas (a mixed gas of a chlorine-based gas and an oxygen gas) having relatively low anisotropy, a light shielding film made of a chromium-based material that has been conventionally widely used is difficult to satisfy a request for formation of finer pattern. Thus, in recent years, a molybdenum silicide-based material has been used for a light shielding film of a mask blank for manufacturing a binary mask. However, a thin film made of a transition metal silicide-based material has a problem of low ArF light fastness, as described above. To solve this problem, a silicon nitride-based material is applied to a light shielding film of a binary mask, as with a phase shift film. This is the simplest approach. A light shielding film of a binary mask is required to have high light shielding performance against ArF exposure light (e.g., an optical density (OD) of 3.0 or more to ArF exposure light). Furthermore, in a light shielding film of a binary mask, a surface reflectance to ArF exposure light (reflectance of a surface on a side opposite to a substrate of the light shielding film) and a back surface reflectance (reflectance of a surface on a side of the substrate of the light shielding film) are likely to be higher than those of a phase shift film. A conventional light shielding layer made of a chromium-based material and a conventional light shielding layer made of a transition metal silicide-based material include a stacked structure of a light shielding layer and an antireflective layer, and a surface reflectance and a back surface reflectance to ArF exposure light are reduced. A silicon nitride-based material has lower light shielding performance against ArF exposure light than a chromium-based material and a transition metal silicide-based material.

A recent binary mask has a problem of large bias that is caused by an electromagnetic field (EMF) effect (correction amount of a pattern line width or the like, hereinafter referred to as EMF bias) when a film thickness of a pattern of a light shielding film is large. To reduce EMF bias of a pattern of a light shielding film, decreasing a film thickness of the light shielding film and decreasing a phase difference of the light shielding film (phase difference between exposure light passing through the light shielding film and exposure light passing through air by the same distance as the thickness of the light shielding film) are effective.

When a light shielding film is formed of a silicon nitride-based material that has relatively low light shielding performance, it is necessary to increase a film thickness of the light shielding film to secure high light shielding performance. Thus, it is not easy to reduce EMF bias of a pattern of the light shielding film, and this has been a problem.

EMF bias significantly influences CD precision of a pattern line width transferred to a resist on a wafer. Thus, it is necessary to simulate an electromagnetic field effect and to correct a transfer pattern produced in a transfer mask for suppressing influence by EMF bias. The correction calculation of this transfer pattern is more complicated as EMF bias is larger. Furthermore, a corrected transfer pattern is also more complicated as EMF bias is larger. A large load is applied in producing a transfer mask.

Then, the present disclosure has been made to solve the conventional problems. An aspect of the present disclosure is to provide a mask blank including a light shielding film on a transparent substrate, wherein the light shielding film is a single layer film formed of a silicon nitride-based material and has high light shielding performance against ArF exposure light, and EMF bias of a pattern of the light shielding film can be reduced. Furthermore, an aspect of the present disclosure is to provide a transfer mask manufactured by using such a mask blank. Further, an aspect of the present disclosure is to provide a method of manufacturing a semiconductor device by using such a transfer mask.

Means for Solving the Problem

To solve the above-described problems, the present disclosure includes the following configurations.

Configuration 1

A mask blank including a light shielding film on a transparent substrate, wherein the light shielding film is a single layer film formed of a material consisting of silicon and nitrogen or a material consisting of silicon, nitrogen, and one or more elements selected from semimetal elements and non-metal elements, the light shielding film has an optical density of 3.0 or more to exposure light of an ArF excimer laser, and a refractive index n and an extinction coefficient k of the light shielding film to the exposure light simultaneously satisfy relationships defined by Formulas (1) and (2) below.

$$n \leq 0.0733 \times k^2 + 0.4069 \times k + 1.0083 \quad \text{Formula (1)}$$

$$n \geq 29.316 \times k^2 - 92.292 \times k + 72.671 \quad \text{Formula (2)}$$

Configuration 2

The mask blank according to Configuration 1, wherein the light shielding film has the extinction coefficient k of 2.6 or less.

Configuration 3

The mask blank according to Configuration 1 or 2, wherein the light shielding film has the refractive index n of 0.8 or more.

Configuration 4

The mask blank according to any of Configurations 1 to 3, wherein the refractive index n and the extinction coefficient k of the light shielding film further satisfy a relationship defined by Formula (3) below.

$$n \geq 0.7929 \times k^2 - 2.1606 \times k + 2.1448 \quad \text{Formula (3)}$$

Configuration 5

The mask blank according to any of Configurations 1 to 4, wherein dispersion of nitrogen content in a thickness direction at a region except for a surface layer on a side of the transparent substrate and a surface layer on a side opposite to the transparent substrate in the light shielding film is 5 atom % or less.

Configuration 6

The mask blank according to any of Configurations 1 to 5, further including a hard mask film formed of a material containing chromium on the light shielding film.

Configuration 7

A transfer mask including a light shielding film including a transfer pattern on a transparent substrate, wherein the light shielding film is a single layer film formed of a material consisting of silicon and nitrogen or a material consisting of silicon, nitrogen, and one or more elements selected from semimetal elements and non-metal elements, the light shielding film has an optical density of 3.0 or more to exposure light of an ArF excimer, and a refractive index n and an extinction coefficient k of the light shielding film to the exposure light simultaneously satisfy relationships defined by Formulas (1) and (2) below.

$$n \leq 0.0733 \times k^2 + 0.4069 \times k + 1.0083 \quad \text{Formula (1)}$$

$$n \geq 29.316 \times k^2 - 92.292 \times k + 72.671 \quad \text{Formula (2)}$$

Configuration 8

The transfer mask according to Configuration 7, wherein the light shielding film has the extinction coefficient k of 2.6 or less.

Configuration 9

The transfer mask according to Configuration 7 or 8, wherein the light shielding film has the refractive index n of 0.8 or more.

Configuration 10

The transfer mask according to any of Configurations 7 to 9, wherein the refractive index n and the extinction coefficient k of the light shielding film further satisfy a relationship defined by Formula (3) below.

$$n \geq 0.7929 \times k^2 - 2.1606 \times k + 2.1448 \quad \text{Formula (3)}$$

Configuration 11

The transfer mask according to any of Configurations 7 to 10, wherein dispersion of nitrogen content in a thickness direction at a region except for a surface layer on a side of the transparent substrate and a surface layer on a side opposite to the transparent substrate in the light shielding film is 5 atom % or less.

Configuration 12

A method of manufacturing a semiconductor device including a step of transferring by exposure a transfer pattern to a resist film on a semiconductor substrate by using the transfer mask according to any of Configurations 7 to 11.

Effect of the Disclosure

A mask blank of the present disclosure includes a light shielding film on a transparent substrate. The light shielding film is a single layer film formed of a silicon nitride-based material, and has an optical density of 3.0 or more to ArF exposure light. A refractive index n and an extinction coefficient k of the light shielding film to ArF exposure light simultaneously satisfy relationships defined by Formulas (1) and (2) below. According to the configuration of such a light shielding film, the optical density of the light shielding film to ArF exposure light is 3.0 or more, and the refractive index n and the extinction coefficient k of the light shielding film to ArF exposure light simultaneously satisfy the relationships defined by Formulas (1) and (2) below. Thus, the light shielding film has high light shielding performance against ArF exposure light and EMF bias of a pattern of the light shielding film can be reduced.

$$n \leq 0.0733 \times k^2 + 0.4069 \times k + 1.0083 \quad \text{Formula (1)}$$

$$n \geq 29.316 \times k^2 - 92.292 \times k + 72.671 \quad \text{Formula (2)}$$

In a transfer mask of the present disclosure, a light shielding film having a transfer pattern includes the same configuration as the configuration of the light shielding film of the mask blank of the present disclosure as mentioned above. Due to such a transfer mask, EMF bias of a pattern of the light shielding film is reduced. Thus, the transfer mask can be produced without applying a large load.

BRIEF DESCRIPTION OF THE DRAWINGS

FIGS. 4A to 4F are cross-sectional views illustrating the steps of manufacturing a transfer mask according to an embodiment of the present disclosure.

EMBODIMENTS FOR CARRYING OUT THE DISCLOSURE

Figure 1:
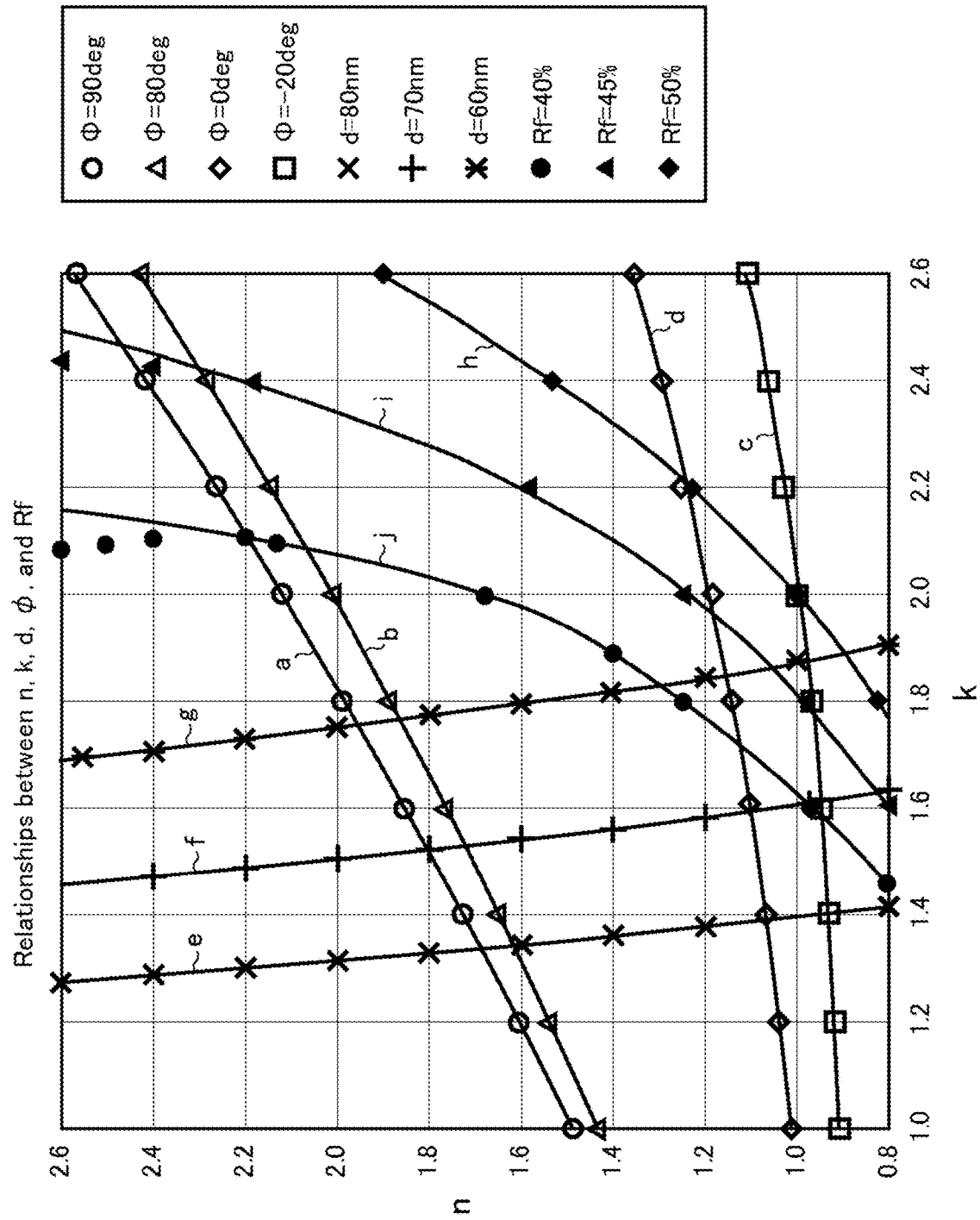
FIG. 1 is a graph showing relationships between a refractive index n and an extinction coefficient k, and a film thickness d, a phase difference φ and a surface reflectance Rf that are derived from simulation results.

First, the circumstances leading to the completion of the present disclosure will be described.

When a light shielding film is formed of a silicon-based material (e.g., a material consisting of silicon) containing no oxygen or nitrogen that causes a reduction in light shielding performance, the light shielding film having a predetermined optical density (e.g., an optical density (OD) of 3.0 or more to ArF exposure light) can be formed with a thinner film thickness. However, silicon atoms unbonded to other elements tend to be bonded to oxygen in air. When a mask blank including a light shielding film made of silicon on a transparent substrate is manufactured and is left to stand in air after the manufacturing, oxidation proceeds, and there arises a problem that the optical characteristics (particularly, light shielding performance) of the light shielding film greatly change from the beginning of its formation.

In a recent process of manufacturing a transfer mask from a mask blank, when a black defect is detected as a result of a mask inspection of a pattern of a light shielding film, it is widely performed to repair the black defect by an EB defect repair technique. In this EB defect repair, while a fluorine-based gas in an unexcited state such as an $XeF_2$ gas is supplied to a periphery of the black defect, a black defect portion is irradiated with an electron beam to remove the black defect. When a difference between an etching rate using the fluorine-based gas in an unexcited state at a portion (black defect portion) of the light shielding film that has been excited by irradiation with an electron beam and an etching rate using the fluorine-based gas in an unexcited state at a portion of the light shielding film that has not been excited is sufficiently secured, this EB defect repair can remove only the black defect portion. The silicon-based material containing no oxygen or nitrogen has low durability for the fluorine-based gas in an unexcited state, and etching easily proceeds even without irradiation with an electron beam (in an unexcited state) (this etching is referred to as spontaneous etching). Thus, a light shielding film made of the silicon-based material containing no oxygen or nitrogen has a problem such that at a side wall of a pattern of the light shielding film except for a black defect, spontaneous etching easily proceeds during EB defect repair.

As a countermeasure for the two problems described above, it is necessary to apply a material containing nitrogen and oxygen incorporated in silicon to a material forming a light shielding film. Light shielding performance of a material containing oxygen incorporated in silicon is very lower than that of a material containing nitrogen incorporated in silicon. When a light shielding film is formed of a silicon-based material, it is preferable that the material containing nitrogen incorporated in silicon (silicon nitride-based material) be applied from the viewpoint described above. A light shielding film made of the silicon nitride-based material has characteristics such that as nitrogen content of the film increases, an extinction coefficient k of the light shielding film to ArF exposure light (hereinafter simply referred to as an extinction coefficient k) decreases, and a refractive index n to ArF exposure light (hereinafter simply referred to as a refractive index n) increases. As the extinction coefficient k of the light shielding film decreases, an optical density of the light shielding film decreases. Thus, to secure a predetermined optical density of the light shielding film, it is necessary to increase a film thickness of the light shielding film. Furthermore, as the refractive index n of the light shielding film increases, a phase difference of the light shielding film increases. An increase in the refractive index n or a decrease in the extinction coefficient k of the light shielding film lead to an increase in EMF bias of the light shielding film. Thus, it is necessary to control the refractive index n and the extinction coefficient k of the light shielding film made of the silicon nitride-based material to be within predetermined ranges.

Here, the present inventors have intensively studied a relationship between the refractive index n and the extinction coefficient k of a light shielding film that can simultaneously satisfy two conditions where the light shielding film of a mask blank for manufacturing a binary mask has a predetermined optical density (OD=3.0 or more) and EMF bias is sufficiently reduced. As a result, the present inventors have concluded that a light shielding film including a configuration described below can secure a predetermined optical density to ArF exposure light and further EMF bias of the light shielding film can be sufficiently reduced, and have completed the present disclosure.

To complete the present disclosure, optical simulation for a light shielding film was first performed. In the optical simulation, it was assumed that exposure light is an ArF excimer laser beam and the light shielding film is a thin film having a single-layer structure including an optically uniform substance. While the refractive index n and the extinction coefficient k are each changed within the range of the refractive index n of from 0.8 to 2.6 and the range of the extinction coefficient k of from 1.0 to 2.6, a phase difference φ, a surface reflectance Rf, and a back surface reflectance Rb in a film thickness d at which an optical density (OD) is 3.0 were determined.

Figure 2:
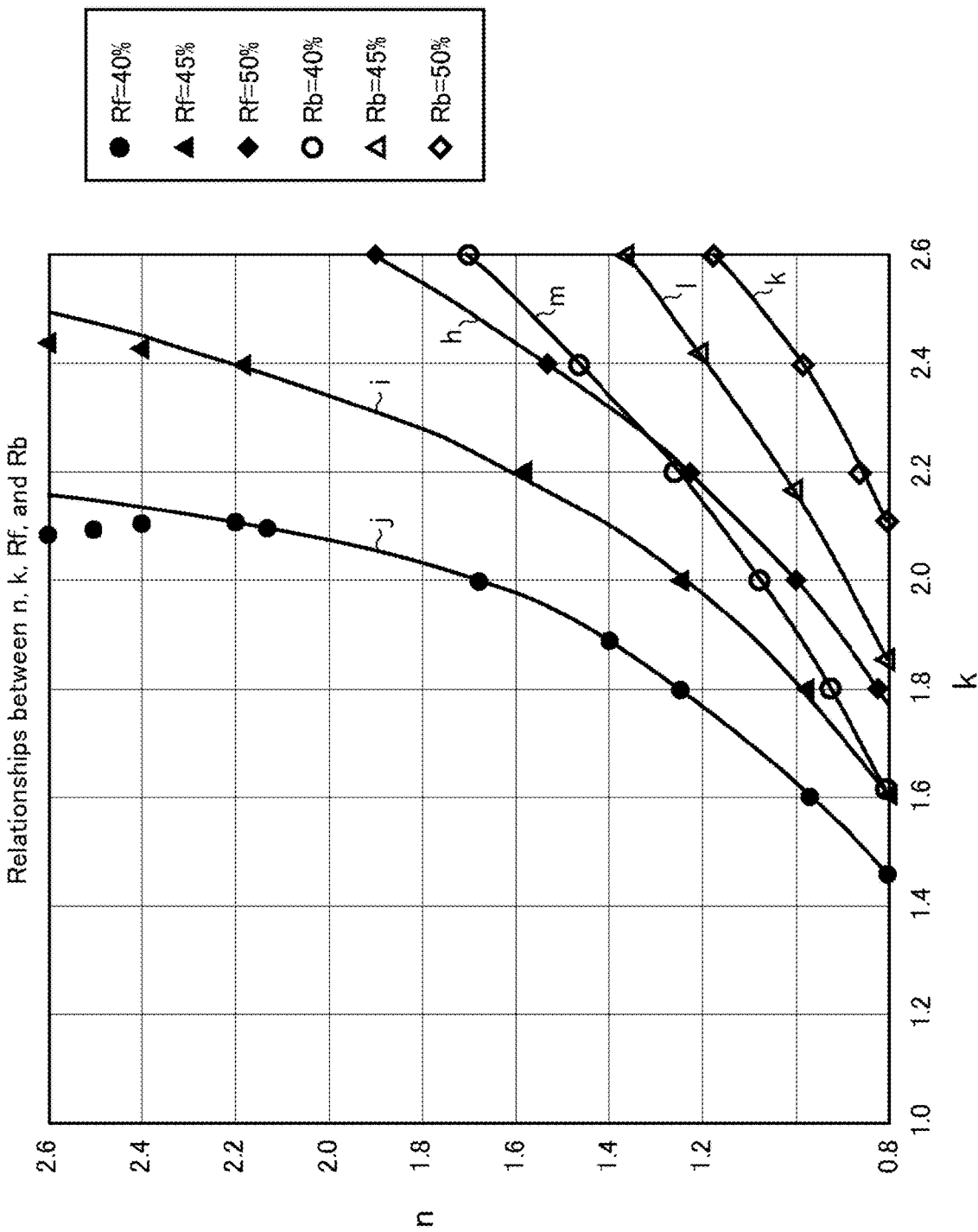
FIG. 2 is a graph showing relationships between a refractive index n and an extinction coefficient k, and a surface reflectance Rf and a back surface reflectance Rb that are derived from simulation results.

Subsequently, from the results of the simulation, relationships between the refractive index n and the extinction coefficient k and the phase difference φ, relationships between the refractive index n and the extinction coefficient k and the film thickness d, relationships between the refractive index n and the extinction coefficient k and the surface reflectance Rf, and relationships between the refractive index n and the extinction coefficient k and the back surface reflectance Rb were organized. Then, from the organized relationships, the relationships between the refractive index n and the extinction coefficient k at the phase difference φ of 90°, 80°, 0°, and −20° (FIG. 1), the relationships between the refractive index n and the extinction coefficient k at the film thickness d of 80 nm, 70 nm, and 60 nm (FIG. 1), the relationships between the refractive index n and the extinction coefficient k at the surface reflectance Rf of 50%, 45%, and 40% (FIGS. 1 and 2), and the relationships between the refractive index n and the extinction coefficient k at the back surface reflectance Rb of 50%, 45%, and 40% (FIG. 2) were determined. In FIGS. 1 and 2, the relationships thus determined are plotted.

FIG. 1 is a graph showing the relationships between the refractive index n and the extinction coefficient k, the film thickness d, the phase difference φ and the surface reflectance Rf that are derived from the simulation results. FIG. 2 is a graph showing the relationships between the refractive index n and the extinction coefficient k, the surface reflectance Rf, and the back surface reflectance Rb that are derived from the simulation results. FIGS. 1 and 2 each show fitted curves obtained from the respective relationships. Data used to obtain fitted curves of Formulas (a) to (m) below is data plotted in FIGS. 1 and 2. Furthermore, each of the following fitted curves varies slightly depending on a calculation system. However, the variation in the range of the refractive index n and the extinction coefficient k caused by the variation in the approximate expression has little influence on the phase difference, the film thickness, the surface reflectance and the back surface reflectance of the light shielding film, and is within an allowable range.

As illustrated in FIG. 1, the fitted curve at the phase difference φ of 90° is represented by Formula (a) below, the fitted curve at the phase difference φ of 80° is represented by Formula (b) below, the fitted curve at the phase difference φ of −20° is represented by Formula (c) below, and the fitted curve at the phase difference φ of 0° is represented by Formula (d) below.

$$n=0.0733 \times k^2+0.4069 \times k+1.0083 \quad \text{Formula (a)}$$

$$n=0.0966 \times k^2+0.3660 \times k+0.9956 \quad \text{Formula (b)}$$

$$n=0.0637 \times k^2-0.1096 \times k+0.9585 \quad \text{Formula (c)}$$

$$n=0.0636 \times k^2-0.0147 \times k+0.9613 \quad \text{Formula (d)}$$

As illustrated in FIG. 1, the fitted curve at the film thickness d of 80 nm is represented by Formula (e) below, the fitted curve at the film thickness d of 70 nm is represented by Formula (f) below, and the fitted curve at the film thickness d of 60 nm is represented by Formula (g) below.

$$n=29.316 \times k^2-92.929 \times k+72.671 \quad \text{Formula (e)}$$

$$n=23.107 \times k^2-82.037 \times k+73.115 \quad \text{Formula (f)}$$

$$n=12.717 \times k^2-54.382 \times k+58.228 \quad \text{Formula (g)}$$

As illustrated in FIGS. 1 and 2, the fitted curve at the surface reflectance Rf of 50% is represented by Formula (h) below, the fitted curve at the surface reflectance Rf of 45% is represented by Formula (i) below, and the fitted curve at the surface reflectance Rf of 40% is represented by Formula (j) below. Note that when the fitted curve of Formula (i) is obtained, two data points plotted at the refractive index n of about 2.4 to about 2.6 are not used. Furthermore, when the fitted curve of Formula (j) is obtained, one data point plotted at the refractive index n of about 2.4 to about 2.6 is not used.

$$n=0.7929 \times k^2-2.1606 \times k+2.1448 \quad \text{Formula (h)}$$

$$n=1.7917 \times k^3-9.1446 \times k^2+16.519 \times k-9.5626 \quad \text{Formula (i)}$$

$$n=15.539 \times k^4-103.99 \times k^3+260.83 \times k^2-289.22 \times k+120.12 \quad \text{Formula (j)}$$

As illustrated in FIG. 2, the fitted curve at the back surface reflectance Rb of 50% is represented by Formula (k) below, the fitted curve at the back surface reflectance Rb of 45% is represented by Formula (l) below, and the fitted curve at the back surface reflectance Rb of 40% is represented by Formula (m) below.

$$n=0.6198 \times k^2-2.1796 \times k+2.6451 \quad \text{Formula (k)}$$

$$n=0.2357 \times k^2-0.2976 \times k+0.5410 \quad \text{Formula (l)}$$

$$n=0.3457 \times k^2-0.5539 \times k+0.8005 \quad \text{Formula (m)}$$

Formula (1) below represents a condition required to adjust the phase difference φ of the light shielding film (OD=3.0) to ArF exposure light to 90° or less. Formula (2) below represents a condition required to adjust the film thickness of the light shielding film (OD=3.0) to 80 nm or less. Formula (3) below represents a condition required to adjust the surface reflectance of the light shielding film (OD=3.0) to ArF exposure light to 50% or less.

$$n \leq 0.0733 \times k^2+0.4069 \times k+1.0083 \quad \text{Formula (1)}$$

$$n \geq 29.316 \times k^2-92.292 \times k+72.671 \quad \text{Formula (2)}$$

$$n \geq 0.7929 \times k^2-2.1606 \times k+2.1448 \quad \text{Formula (3)}$$

When the relationships of Formulas (1) and (2) are simultaneously satisfied, the film thickness of the light shielding film having the OD of 3.0 can be 80 nm or less, and the phase difference φ of the light shielding film can be 90° or less. Thus, EMF bias of a pattern of the light shielding film is reduced, and a load in manufacturing a transfer mask by using a mask blank having this light shielding film is also reduced. Further, when the relationship of Formula (3) is satisfied, the surface reflectance of the light shielding film having the OD of 3.0 can be 50% or less. Thus, deterioration of a projected optical image during transfer by exposure is easily suppressed. Note that as illustrated in FIG. 2, when the surface reflectance is 50% or less, the back surface reflectance is also 50% or less, and thus, when the relationship of Formula (3) is satisfied, deterioration due to back surface reflection of the light shielding film of a projected optical image during transfer by exposure is easily suppressed.

Formula (4) below represents a condition required to adjust the phase difference φ of the light shielding film (OD=3.0) to ArF exposure light to 80° or less. Formula (5) below represents a condition required to adjust the phase difference φ of the light shielding film (OD=3.0) to ArF exposure light to −20° or more. Formula (6) below represents a condition required to adjust the phase difference φ of the light shielding film (OD=3.0) to ArF exposure light to 0° or more.

$$n \leq 0.0966 \times k^2+0.3660 \times k+0.9956 \quad \text{Formula (4)}$$

$$n \geq 0.0637 \times k^2-0.1096 \times k+0.9585 \quad \text{Formula (5)}$$

$$n \geq 0.0636 \times k^2-0.0147 \times k+0.9613 \quad \text{Formula (6)}$$

When the relationship of Formula (4) is satisfied, the phase difference φ of the light shielding film having the OD of 3.0 can be 80° or less. Thus, EMF bias of a pattern of the light shielding film is further reduced, and a load in manufacturing a transfer mask by using a mask blank having this light shielding film is also reduced.

When the relationship of Formula (5) is satisfied, the phase difference φ of the light shielding film having the OD of 3.0 can be −20° or more. When the relationship of Formula (6) is satisfied, the phase difference φ of the light shielding film having the OD of 3.0 can be 0° or more.

Formula (7) below represents a condition required to adjust the film thickness of the light shielding film (OD=3.0) to 70 nm or less. Furthermore, Formula (8) below represents a condition required to adjust the film thickness of the light shielding film (OD=3.0) to 60 nm or less.

$$n \geq 23.107 \times k^2-82.037 \times k+73.115 \quad \text{Formula (7)}$$

$$n \geq 12.717 \times k^2-54.382 \times k+58.228 \quad \text{Formula (8)}$$

When the relationship of Formula (7) is satisfied, the film thickness of the light shielding film having the OD of 3.0 can be 70 nm or less. Thus, EMF bias of a pattern of the light shielding film is further reduced. Furthermore, when the relationship of Formula (8) is satisfied, the film thickness of the light shielding film having the OD of 3.0 can be 60 nm or less. Thus, EMF bias of a pattern of the light shielding film is further reduced.

Formula (9) below represents a condition required to adjust the surface reflectance of the light shielding film (OD=3.0) to ArF exposure light to 45% or less. Formula (10) below represents a condition required to adjust the surface reflectance of the light shielding film (OD=3.0) to ArF exposure light to 40% or less.

$$n \geq 1.7917 \times k^3 - 9.1446 \times k^2 + 16.519 \times k - 9.5626 \quad \text{Formula (9)}$$

$$n \geq 15.539 \times k^4 - 103.99 \times k^3 + 260.83 \times k^2 - 289.22 \times k + 120.12 \quad \text{Formula (10)}$$

When the relationship of Formula (9) is satisfied, the surface reflectance of the light shielding film having the OD of 3.0 can be 45% or less. Thus, deterioration of a projected optical image during transfer by exposure is more easily suppressed. Furthermore, when the relationship of Formula (10) is satisfied, the surface reflectance of the light shielding film having the OD of 3.0 can be 40% or less. Thus, deterioration of a projected optical image during transfer by exposure is more easily suppressed. Note that as illustrated in FIG. 2, when the surface reflectance is 45% or less, the back surface reflectance is also 45% or less, and thus, when the relationship of Formula (9) is satisfied, deterioration due to back surface reflection of a projected optical image during transfer by exposure is more easily suppressed, and furthermore when the surface reflectance is 40% or less, the back surface reflectance is also 40% or less, and thus, when the relationship of Formula (10) is satisfied, deterioration due to back surface reflection of a projected optical image during transfer by exposure is more easily suppressed.

Next, embodiments of the present disclosure will be described.

Figure 3:
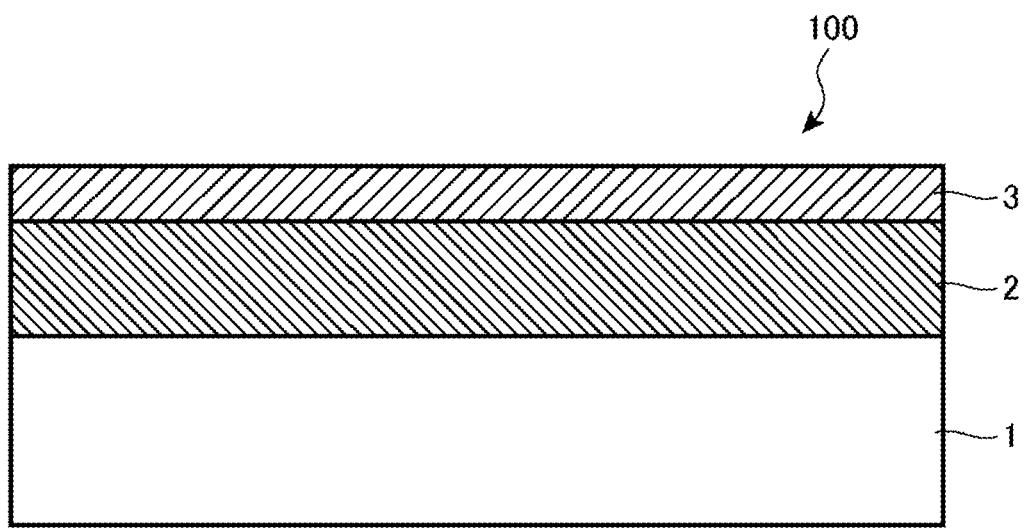
FIG. 3 is a cross-sectional view illustrating a configuration of a mask blank according to an embodiment of the present disclosure.

FIG. 3 is a cross-sectional view illustrating a configuration of a mask blank 100 according to an embodiment of the present disclosure.

The mask blank 100 illustrated in FIG. 3 includes a structure where a light shielding film 2 and a hard mask film 3 are layered in this order on a transparent substrate 1.

Transparent Substrate

The transparent substrate 1 includes a material containing silicon and oxygen. The transparent substrate 1 can be formed of a glass material such as synthetic quartz glass, quartz glass, aluminosilicate glass, soda-lime glass, and low thermal expansion glass ($SiO_2$—$TiO_2$ glass, etc.). Among these, synthetic quartz glass has a high transmittance to ArF exposure light and is particularly preferable as a material forming a transparent substrate of a mask blank.

Light Shielding Film

The light shielding film 2 is a single layer film formed of a silicon nitride-based material. The silicon nitride-based material in the present disclosure is a material consisting of silicon and nitrogen or a material consisting of silicon, nitrogen, and one or more elements selected from semimetal elements and non-metal elements. Furthermore, since the light shielding film 2 is a single layer film, the number of manufacturing steps decreases, production efficiency increases, and control of manufacturing quality including defects is facilitated. Furthermore, since the light shielding film 2 is formed of the silicon nitride-based material, the light shielding film 2 has high ArF light fastness.

The light shielding film 2 may contain any semimetal element in addition to silicon. Among the semimetal elements, the light shielding film 2 preferably contains one or more elements selected from boron, germanium, antimony, and tellurium. This is because an increase in conductivity of silicon used as a sputtering target can be expected.

Furthermore, the light shielding film 2 may contain any non-metal elements in addition to nitrogen. The non-metal element in the present disclosure includes a narrowly-defined non-metal element (nitrogen, carbon, oxygen, phosphorus, sulfur, selenium, and hydrogen), halogen (fluorine, chlorine, bromine, iodine, etc.), and a noble gas. Among the non-metal elements, the light shielding film 2 preferably contains one or more elements selected from carbon, fluorine, and hydrogen. Oxygen content of the light shielding film 2 except for a surface layer on a side of the transparent substrate 1 and a surface layer on a side opposite to the transparent substrate as described below 1 is preferably reduced to 5 atom % or less, and more preferably 3 atom % or less. It is further preferable that oxygen is not actively incorporated in the light shielding film 2 (the oxygen content is equal to or lower than the lowest detection limit as determined by composition analysis with X-ray electron spectroscopy or the like). When oxygen is incorporated in the silicon nitride-based material, the extinction coefficient k decreases, and sufficient light shielding performance is difficult to obtain. Furthermore, the transparent substrate 1 is generally formed of a material containing, as a main component, silicon oxide such as synthetic quartz glass. When the light shielding film 2 is disposed in contact with a surface of the transparent substrate 1 and contains oxygen, a difference between composition of a film of a silicon nitride-based material containing oxygen and composition of the transparent substrate reduces. In dry etching using a fluorine-based gas during formation of a pattern in the light shielding film 2, etching selectivity between the light shielding film 2 in contact with the transparent substrate 1 and the transparent substrate 1 may be difficult to obtain. Furthermore, when oxygen content of the light shielding film 2 is high, a repair rate during EB defect repair significantly decreases.

A noble gas is an element that is capable of increasing a deposition rate to improve productivity by being present in the film forming chamber when the light-shielding film 2 is formed by reactive sputtering. The noble gas becomes plasma and collides with a target. As a result, a target constituent element is emitted from the target, and the light shielding film 2 is formed on the transparent substrate 1 while taking in the reactive gas. The noble gas in the film forming chamber is slightly incorporated until the target constituent element is emitted from the target and adheres to the transparent substrate 1. Preferable examples of the noble gas necessary for reactive sputtering include argon, krypton, and xenon. Furthermore, to relax stress of the light shielding film 2, helium and neon having a small atomic weight may be incorporated actively in the light shielding film 2.

The light shielding film 2 is preferably formed of a material consisting of silicon and nitrogen. The noble gas is slightly incorporated when the light shielding film 2 is formed by reactive sputtering, as described above. However, the noble gas is an element that is difficult to detect by composition analysis such as Rutherford Back-Scattering Spectrometry (RBS) and X-ray Photoelectron Spectroscopy (XPS) of a thin film. Thus, the material consisting of silicon and nitrogen can be considered to include a material containing the noble gas.

In the light shielding film 2, dispersion of nitrogen content in a thickness direction at a region except for the surface layer on the side of the transparent substrate 1 and the surface layer on the side opposite to the transparent substrate 1 (hereinafter referred to as a bulk region) is preferably 5 atom % or less, and more preferably 3 atom % or less. When the dispersion is 5 atom % or less, composition can be said to be uniform. On the other hand, when the light shielding film 2 is subjected to the above-described composition analysis with RBS and XPS, analysis results of the surface layer on the side of the transparent substrate 1 are influenced by the transparent substrate 1. Thus, composition of the surface layer is difficult to be the same as composition of the bulk region. Furthermore, since natural oxidation occurs, composition of the surface layer on the side opposite to the transparent substrate 1 is difficult to be the same as the composition of the bulk region. Furthermore, when oxygen is actively incorporated in the surface layer on the side opposite to the transparent substrate 1, a change in characteristics of the light shielding film 2 such as a change in a surface reflectance to ArF exposure light during mask washing or storage in air can be suppressed. Examples of a method of actively incorporating oxygen in the surface layer on the side opposite to the transparent substrate 1 include a method in which the light shielding film 2 is formed by sputtering, and then subjected to a post-treatment such as a heating treatment in a gas containing oxygen such as air, a light irradiation treatment with a flash lamp or the like in a gas containing oxygen such as air, and a treatment of bringing ozone or oxygen plasma into contact with a surface of the light shielding film. Note that the surface layer of the light shielding film 2 on the side of the transparent substrate 1 refers to a region from an interface between the light shielding film 2 and the transparent substrate 1 to a depth of 5 nm toward the surface layer side on the opposite side. Furthermore, the surface layer of the light shielding film 2 on the side opposite to the transparent substrate 1 refers to a region from a surface of the light shielding film 2 on the side opposite to the transparent substrate 1 to a depth of 5 nm toward the transparent substrate 1 side.

Nitrogen content of the light shielding film 2 is preferably 50 atom % or less, and more preferably 45 atom % or less. When the nitrogen content is more than 50 atom %, the extinction coefficient k to ArF exposure light decreases, and sufficient light shielding performance is difficult to obtain. Furthermore, the nitrogen content of the light shielding film 2 is preferably 25 atom % or more, and more preferably 30 atom % or more. When the nitrogen content is less than 25 atom %, washing durability is likely to be insufficient, oxidation is also likely to occur, and stability of a film over time is likely to be impaired. Further, when the light shielding film 2 is subjected to EB defect repair, spontaneous etching is likely to occur.

Silicon content of the light shielding film 2 is preferably 50 atom % or more, and more preferably 55 atom % or more. When the silicon content is less than 50 atom %, the extinction coefficient k to ArF exposure light decreases, and sufficient light shielding performance is difficult to obtain. Furthermore, the silicon content of the light shielding film 2 is preferably 75 atom % or less, and more preferably 70 atom % or less. When the silicon content is more than 75 atom %, washing durability is likely to be insufficient, oxidation is also likely to occur, and stability of a film over time is likely to be impaired.

A thickness of the light shielding film 2 is 80 nm or less, preferably 70 nm or less, and more preferably 60 nm or less. When the thickness is 80 nm or less, a fine pattern of the light shielding film is likely to be formed. Furthermore, EMF bias of a pattern of the light shielding film is reduced, and a load in manufacturing a transfer mask by using a mask blank having this light shielding film is also reduced. Furthermore, the thickness of the light shielding film 2 is preferably 40 nm or more, and more preferably 45 nm or more. When the thickness of the light shielding film 2 is less than 40 nm, sufficient light shielding performance against ArF exposure light is difficult to obtain.

An optical density of the light shielding film 2 to ArF exposure light is preferably 3.0 or more. When the optical density is 3.0 or more, sufficient light shielding performance is obtained. Thus, when a transfer mask manufactured by using the mask blank is used in exposure, sufficient contrast of a projected optical image (transfer image) of the transfer mask is likely to be obtained. Furthermore, the optical density of the light shielding film 2 to ArF exposure light is preferably 4.0 or less, and more preferably 3.5 or less. When the optical density is more than 4.0, the film thickness of the light shielding film 2 increases and a fine pattern of the light shielding film is difficult to form.

A surface reflectance of the light shielding film 2 to ArF exposure light (reflectance of the surface on the side opposite to the transparent substrate 1) is preferably 50% or less, more preferably 45% or less, and further preferably 40% or less. When the surface reflectance is more than 50%, reflection of ArF exposure light is too large, and a projected optical image during transfer by exposure is likely to be deteriorated. Furthermore, the surface reflectance of the light shielding film 2 to ArF exposure light is preferably 20% or more. When the surface reflectance is less than 20%, pattern inspection sensitivity during a mask pattern inspection using light having a wavelength of 193 nm or a wavelength in the vicinity thereof reduces.

A back surface reflectance of the light shielding film 2 to ArF exposure light (reflectance of the surface on the side of the transparent substrate 1) is preferably 50% or less, more preferably 45% or less, and further preferably 40% or less. When the back surface reflectance is more than 50%, reflection of exposure light is too large, and a projected optical image during transfer by exposure is likely to be deteriorated.

A phase difference of the light shielding film 2 to ArF exposure light is 90° or less, and preferably 80° or less. When the phase difference is 90° or less, EMF bias of a pattern of the light shielding film 2 is reduced, and a load in manufacturing a transfer mask by using a mask blank having this light shielding film is also reduced. Furthermore, the phase difference of the light shielding film 2 to ArF exposure light is preferably −20° or more, and more preferably 0° or more.

The refractive index n and the extinction coefficient k of the light shielding film 2 to ArF exposure light satisfy relationships defined by Formulas (1) and (2) below. When the relationship of Formula (1) is satisfied, the phase difference of the light shielding film 2 to ArF exposure light can be 90° or less. When the relationship of Formula (2) is satisfied, the thickness of the light shielding film can be 80 nm or less. Thus, when the relationships of Formulas (1) and (2) are satisfied, EMF bias of a pattern of the light shielding film 2 is reduced, and a load in manufacturing a transfer mask by using a mask blank having this light shielding film is also reduced. Furthermore, it is preferable that the refractive index n and the extinction coefficient k to ArF exposure light satisfy a relationship defined by Formula (3) below. When the relationship of Formula (3) is satisfied, the surface reflectance of the light shielding film 2 can be 50% or less, and furthermore, as described above, the back surface reflectance of the light shielding film 2 can also be 50% or less.

Thus, when the relationship of Formula (3) is satisfied, deterioration of a projected optical image during transfer by exposure is easily suppressed.

$$n \leq 0.0733 \times k^2 + 0.4069 \times k + 1.0083 \quad \text{Formula (1)}$$

$$n \geq 29.316 \times k^2 - 92.292 \times k + 72.671 \quad \text{Formula (2)}$$

$$n \geq 0.7929 \times k^2 - 2.1606 \times k + 2.1448 \quad \text{Formula (3)}$$

It is preferable that the refractive index n and the extinction coefficient k of the light shielding film 2 to ArF exposure light satisfy a relationship of Formula (4) below. When the relationship of Formula (4) is satisfied, the phase difference of the light shielding film 2 to ArF exposure light can be 80° or less, EMF bias of a pattern of the light shielding film 2 is further reduced, and a load in manufacturing a transfer mask by using a mask blank having this light shielding film is also reduced. Furthermore, it is preferable that the refractive index n and the extinction coefficient k to ArF exposure light satisfy a relationship of Formula (5) below. It is more preferable that the refractive index n and the extinction coefficient k to ArF exposure light satisfy a relationship of Formula (6) below. When the relationship of Formula (5) is satisfied, the phase difference of the light shielding film 2 to ArF exposure light can be −20° or more. When the relationship of Formula (6) is satisfied, the phase difference of the light shielding film 2 to ArF exposure light can be 0° or more.

$$n \leq 0.0966 \times k^2 + 0.3660 \times k + 0.9956 \quad \text{Formula (4)}$$

$$n \geq 0.0637 \times k^2 - 0.1096 \times k + 0.9585 \quad \text{Formula (5)}$$

$$n \geq 0.0636 \times k^2 - 0.0147 \times k + 0.9613 \quad \text{Formula (6)}$$

It is preferable that the refractive index n and the extinction coefficient k of the light shielding film 2 to ArF exposure light satisfy a relationship of Formula (7) below. It is more preferable that the refractive index n and the extinction coefficient k of the light shielding film 2 to ArF exposure light satisfy a relationship of Formula (8) below. When the relationship of Formula (7) is satisfied, the thickness of the light shielding film can be 70 nm or less, EMF bias of a pattern of the light shielding film 2 is further reduced, and a load in manufacturing a transfer mask by using a mask blank having this light shielding film is also reduced. Furthermore, when the relationship of Formula (8) is satisfied, the thickness of the light shielding film can be 60 nm or less, EMF bias of a pattern of the light shielding film 2 is further reduced, and a load in manufacturing a transfer mask by using a mask blank having this light shielding film is also further reduced.

$$n \geq 23.107 \times k^2 - 82.037 \times k + 73.115 \quad \text{Formula (7)}$$

$$n \geq 12.717 \times k^2 - 54.382 \times k + 58.228 \quad \text{Formula (8)}$$

It is preferable that the refractive index n and the extinction coefficient k of the light shielding film 2 to ArF exposure light satisfy a relationship of Formula (9) below. It is more preferable that the refractive index n and the extinction coefficient k of the light shielding film 2 to ArF exposure light satisfy a relationship of Formula (10) below. When the relationship of Formula (9) is satisfied, the surface reflectance of the light shielding film 2 can be 45% or less, and furthermore, as described above, the back surface reflectance of the light shielding film 2 can also be 45% or less, and deterioration of a projected optical image during transfer by exposure is easily suppressed. Furthermore, when the relationship of Formula (10) is satisfied, the surface reflectance of the light shielding film 2 can be 40% or less, and furthermore, as described above, the back surface reflectance of the light shielding film 2 can also be 40% or less, and deterioration of a projected optical image during transfer by exposure is more easily suppressed.

$$n \geq 1.7917 \times k^3 - 9.1446 \times k^2 + 16.519 \times k - 9.5626 \quad \text{Formula (9)}$$

$$n \geq 15.539 \times k^4 - 103.99 \times k^3 + 260.83 \times k^2 - 289.22 \times k + 120.12 \quad \text{Formula (10)}$$

The refractive index n of the light shielding film 2 to ArF exposure light is preferably 0.8 or more, more preferably 0.9 or more, and further preferably 1.0 or more. To obtain the refractive index n of less than 0.8, it is necessary to significantly decrease the nitrogen content of the light shielding film 2. Thus, when the refractive index is less than 0.8, spontaneous etching is likely to occur during EB defect repair.

The extinction coefficient k of the light shielding film 2 to ArF exposure light is preferably 2.6 or less, more preferably 2.5 or less, and further preferably 2.4 or less. To obtain the extinction coefficient k of more than 2.6, it is necessary to significantly decrease the nitrogen content of the light shielding film 2. Thus, when the extinction coefficient k is more than 2.6, spontaneous etching is likely to occur during EB defect repair.

Note that in the light shielding film 2, oxidation of the surface layer on the side opposite to the transparent substrate 1 proceeds. Thus, the surface layer of the light shielding film 2 has different composition and different optical characteristics from composition and optical characteristics of a region of the light shielding film 2 except for the surface layer. However, the light shielding film 2 is used herein as a single layer film of which optical characteristics in a film thickness direction are uniform. Accordingly, the refractive index n and the extinction coefficient k of the light shielding film 2 refers to herein the refractive index n and the extinction coefficient k of all the light shielding film 2 including the surface layer.

The refractive index n and the extinction coefficient k of a thin film are not determined by only composition of the thin film. Film density and a crystal state of the thin film are also factors affecting the refractive index n and the extinction coefficient k. Thus, conditions when the light shielding film 2 is formed by reactive sputtering are adjusted to make the light shielding film 2 have the desired refractive index n and the desired extinction coefficient k, and the light shielding film is formed such that the optical density, the surface reflectance, the back surface reflectance, and the phase difference to ArF exposure light fall within defined values. A way to make the refractive index n and the extinction coefficient k of the light shielding film 2 fall within the above-described ranges is not limited to adjusting a ratio of a noble gas and a reactive gas in a mixed gas when film formation is performed by reactive sputtering. There are various ways such as adjusting a pressure within a film forming chamber when film formation is performed by reactive sputtering, adjusting electric power applied to a target, and adjusting a positional relationship such as a distance between a target and a transparent substrate. Furthermore, these film forming conditions are specific to a film forming device and are adjusted appropriately to make the light shielding film 2 have the desired refractive index n and the desired extinction coefficient k.

The light shielding film 2 is formed by sputtering. Any of sputtering such as DC sputtering, RF sputtering, and ion beam sputtering is applicable. When a target having low conductivity (such as a silicon target, a silicon compound target containing no or a little semimetal element) is used, RF sputtering or ion beam sputtering is preferably applied, but RF sputtering is more preferably applied from the viewpoint of a film forming rate.

The light shielding film 2 is formed by reactive sputtering in a sputtering gas containing a nitrogen-based gas and a noble gas with use of a silicon target or a target including a material containing one or more elements selected from semimetal elements and non-metal elements which are incorporated in silicon.

As the nitrogen-based gas used as a sputtering gas when the light shielding film 2 is formed, any gas is applicable as long as the gas is a gas containing nitrogen. As described above, the light shielding film 2 except for the surface layer preferably has a low oxygen content. Thus, a nitrogen-based gas containing no oxygen is preferably applied, and a nitrogen gas ($N_2$ gas) is more preferably applied. Furthermore, a type of noble gas used as a sputtering gas when the light shielding film 2 is formed is not limited. Argon, krypton, or xenon is preferably used. Furthermore, to relax stress of the light shielding film 2, helium and neon having a small atomic weigh can be incorporated actively in the light shielding film 2.

Hard Mask Film

In the mask blank 100 including the light shielding film 2, it is preferable that the hard mask film 3 formed of a material having etching selectivity for an etching gas used during etching of the light shielding film 2 be further be stacked on the light shielding film 2. Since it is necessary to ensure a predetermined optical density of the light shielding film 2, the light shielding film 2 has a lower limit of the thickness. The hard mask film 3 has a film thickness sufficient to be capable of functioning as an etching mask until end of dry etching for forming a pattern in the light shielding film 2 located immediately under the hard mask film 3, and the thickness of the hard mask film 3 is not basically limited by optical characteristics. Thus, the hard mask film 3 can have the thickness significantly smaller than the thickness of the light shielding film 2. Then, since a resist film made of an organic material has a film thickness sufficient to be capable of functioning as an etching mask until end of dry etching for forming a pattern in this hard mask film 3, the resist film can have the thickness significantly smaller than the thickness of a conventional resist film. Thus, occurrence of a problem such as resist pattern collapse can be suppressed.

The hard mask film 3 is preferably formed of a chromium (Cr)-containing material. The chromium-containing material has particularly high durability for dry etching using a fluorine-based gas such as $SF_6$. A thin film including the chromium-containing material is generally patterned by dry etching using a mixed gas of a chlorine-based gas and an oxygen gas. However, this dry etching does not have sufficiently high anisotropy. Thus, when the thin film made of the chromium-containing material is patterned by dry etching, etching in a side wall direction of a pattern (side etching) is likely to proceed. When the chromium-containing material is used for a light shielding film, since the light shielding film 2 has the film thickness relatively large, a problem involved in side etching occurs during dry etching of the light shielding film 2. However, when the chromium-containing material is used as the hard mask film 3, since the hard mask film 3 has the relatively small film thickness, a problem due to side etching rarely occurs.

Examples of the chromium-containing material include a chrome metal and a material containing one or more elements selected from oxygen, nitrogen, carbon, boron, and fluorine and incorporated in chromium, such as CrN, CrC, CrON, CrCO, and CrCON. A film made of a material containing these elements added to the chrome metal is likely to be a film including an amorphous structure, and since surface roughness of the film and line edge roughness in dry etching of the light shielding film 2 are suppressed, the film is preferable.

Furthermore, from the viewpoint of dry etching of the hard mask film 3, a material containing one or more elements selected from oxygen, nitrogen, carbon, boron, and fluorine and incorporated in chromium is preferably used as a material forming the hard mask film 3.

A chromium based material is etched with a mixed gas of a chlorine-based gas and an oxygen gas. However, a chromium metal has an etching rate relatively low for this etching gas. When one or more elements selected from oxygen, nitrogen, carbon, boron, and fluorine is incorporated in chromium, an etching rate for the etching mixed gas of a chlorine-based gas and an oxygen gas can be enhanced.

Note that the hard mask film 3 including CrCO contains no nitrogen being likely to increase side etching and contains carbon suppressing side etching and oxygen enhancing an etching rate, and thus is particularly preferable for dry etching using a mixed gas of a chlorine-based gas and an oxygen gas. Furthermore, the chromium-containing material forming the hard mask film 3 may contain one or more elements of indium, molybdenum, and tin. When the chromium-containing material forming the hard mask film 3 contains one or more elements of indium, molybdenum, and tin, an etching rate for a mixed gas of a chlorine-based gas and an oxygen gas can be more enhanced.

As a material forming the hard mask film 3 except for the chromium-containing material, a metal such as tantalum (Ta) and tungsten (W) or a material containing a metal such as tantalum can be used. In this case, examples of the material containing tantalum include a tantalum metal and a material containing one or more elements selected from nitrogen, boron, and carbon and incorporated in tantalum. Specific examples thereof include Ta, TaN, TaO, TaON, TaBN, TaBO, TaBON, TaCN, TaCO, TaCON, TaBCN, and TaBOCN.

In the mask blank 100, a resist film made of an organic material and having a film thickness of 100 nm or less is preferably formed in contact with a surface of the hard mask film 3. In the case of a fine pattern supporting the hp 32 nm generation of DRAMs, a Sub-Resolution Assist Feature (SRAF) having a line width of 40 nm may be provided in a transfer pattern to be formed in the hard mask film 3. However, since even in such a case, an aspect ratio of a cross section of a resist pattern can be as low as 1:2.5, collapsing or peeling off of the resist pattern during development, rinsing, or the like of the resist film can be suppressed. Note that a film thickness of the resist film is more preferably 80 nm or less.

In the mask blank 100, a resist film can also be formed directly in contact with the light shielding film 2 without the hard mask film 3 being provided. In this case, the mask blank 100 includes a simple structure and dry etching of the hard mask film 3 becomes unnecessary when a transfer mask is manufactured. Thus, the number of manufacturing steps can be decreased. Note that in this case, it is preferable that the light shielding film 2 be subjected to a surface treatment using hexamethyldisilazane (HMDS) or the like to form the resist film.

Furthermore, the mask blank of the present disclosure is a mask blank suitable for application of a binary mask, as described below. However, the mask blank is not limited to the application of a binary mask. The mask blank can be used as a mask blank for a Levenson phase shift mask or a mask blank for a Chromeless Phase Lithography (CPL) mask.

Transfer Mask

FIGS. 4A to 4F are schematic cross-sectional views illustrating steps of manufacturing a transfer mask (binary mask) 200 with use of the mask blank 100 according to the embodiment of the present disclosure.

In a method of manufacturing the transfer mask 200 illustrated in FIGS. 4A to 4F, the mask blank 100 as described above is used. The method includes the steps of forming a transfer pattern in the hard mask film 3 by dry etching, forming a transfer pattern in the light shielding film 2 by dry etching using the hard mask film 3 including the transfer pattern (hard mask pattern 3a), and removing the hard mask pattern 3a.

Hereinafter, an example of the method of manufacturing the transfer mask 200 will be described in accordance with the manufacturing steps illustrated in FIGS. 4A to 4F. Note that in this example, a material containing silicon and nitrogen is applied to the light shielding film 2 and a chromium-containing material is applied to the hard mask film 3.

First, the mask blank 100 (see FIG. 4A) is prepared and a resist film is formed in contact with the hard mask film 3 by a spin coating method. Next, a transfer pattern to be formed in the light shielding film 2 is written by exposure in the resist film and a predetermined treatment such as a development treatment is further performed to form a resist pattern 4a (see FIG. 4B).

Subsequently, dry etching using a chlorine-based gas such as a mixed gas of chlorine and oxygen is performed by using the resist pattern 4a as a mask, to form a pattern (hard mask pattern 3a) in the hard mask film 3 (see FIG. 4C). The chlorine-based gas is not particularly limited as long as the chlorine-based gas contains Cl. Examples of the chlorine-based gas can include $Cl_2$, $SiCl_2$, $CHCl_3$, $CH_2Cl_2$, and $BCl_3$. When the mixed gas of chlorine and oxygen is used, a flow rate ratio of the gas may be, for example, $Cl_2:O_2=4:1$.

Next, the resist pattern 4a is removed by ashing or using a resist stripper (see FIG. 4D).

Subsequently, dry etching using a fluorine-based gas is performed by using the hard mask pattern 3a as a mask, to form a pattern (light shielding film pattern 2a) in the light shielding film 2 (see FIG. 4E). As the fluorine-based gas, any gas containing F can be used, and $SF_6$ is favorable. In addition to $SF_6$, examples of the fluorine-based gas can include $CHF_3$, $CF_4$, $C_2F_6$, and $C_4F_8$. A fluorine-based gas containing C has an etching rate relatively high for the transparent substrate 1 made of a glass material. Since $SF_6$ causes a small damage to the transparent substrate 1, $SF_6$ is preferable. Note that it is more preferable to add He or the like to $SF_6$.

Subsequently, the hard mask pattern 3a is removed by using a chromium etching liquid and a predetermined treatment such as washing is performed to obtain the transfer mask 200 (see FIG. 4F). Note that at the step of removing the hard mask pattern 3a, dry etching using a mixed gas of chlorine and oxygen may be performed. Here, an example of the chromium etching liquid can include a mixture containing diammonium cerium nitrate and perchloric acid.

The transfer mask 200 manufactured by the manufacturing method illustrated in FIGS. 4A to 4F is a binary mask including the light shielding film 2 including the transfer pattern (light shielding film pattern 2a) on the transparent substrate 1. The light shielding film 2 is a single layer film formed of the material containing silicon and nitrogen, and has an optical density of 3.0 or more to ArF exposure light. The refractive index n and the extinction coefficient k of the light shielding film 2 to ArF exposure light simultaneously satisfy relationships defined by Formulas (1) and (2) below.

$$n \leq 0.0733 \times k^2 + 0.4069 \times k + 1.0083 \quad \text{Formula (1)}$$

$$n \geq 29.316 \times k^2 - 92.292 \times k + 72.671 \quad \text{Formula (2)}$$

Items about the transparent substrate 1 and the light shielding film 2 in the transfer mask 200 have the same technical features as items about the transparent substrate 1 and the light shielding film 2 in the mask blank 100.

In the transfer mask 200, the optical density of the light shielding film pattern 2a is 3.0 or more, and the refractive index n and the extinction coefficient k of the light shielding film pattern 2a to ArF exposure light simultaneously satisfy the relationships defined by Formulas (1) and (2). Thus, the light shielding film pattern 2a has high light shielding performance against ArF light exposure. Furthermore, EMF bias of the pattern of the light shielding film 2 can be reduced, and thus the transfer mask 200 can be produced without generating a large load.

Note that the case where the transfer mask 200 is a binary mask is described here; however, the transfer mask of the present disclosure is not limited to a binary mask and can be applied to a Levenson phase shift mask and a CPL mask. That is, in the case of a Levenson phase shift mask, the light shielding film of the present disclosure can be used for a light shielding film of the mask. Furthermore, in the case of a CPL mask, the light shielding film of the present disclosure can be used at a region mainly including an outer circumferential light shielding band.

Further, a method of manufacturing a semiconductor device of the present disclosure includes transferring by exposure a pattern to a resist film on a semiconductor substrate by using the above-described transfer mask 200 or the transfer mask 200 manufactured by using the above-described mask blank 100.

The transfer mask 200 and the mask blank 100 of the present disclosure have the effects described above. Thus, when the transfer mask 200 is set on a mask stage of an exposure apparatus using an ArF excimer laser as exposure light and a transfer pattern is transferred by exposure to a resist film on a semiconductor device, the transfer pattern can be transferred to the resist film on the semiconductor device with high CD accuracy. Thus, when a circuit pattern is formed by dry etching an underlayer film by using a pattern of the resist film as a mask, the circuit pattern can be formed with high precision without shortcut and disconnection of wiring due to insufficient precision.

EXAMPLES

Hereinafter, embodiments of the present disclosure will be described more specifically by way of examples.

Example 1

Manufacture of Mask Blank

A transparent substrate 1 having a main surface dimension of approximately 152 mm×approximately 152 mm and a thickness of approximately 6.25 mm and including synthetic quartz glass was prepared. An end surface and the main surface of this transparent substrate 1 were polished to predetermined surface roughness and subsequently subjected to a predetermined washing treatment and a predetermined drying treatment.

Next, the transparent substrate 1 was installed in a single-wafer RF sputtering apparatus. A light shielding film 2 consisting of silicon and nitrogen and having a thickness of 58.8 nm was formed on the transparent substrate 1 by reactive sputtering (RF sputtering) using a silicon (Si) target and using a mixed gas of krypton (Kr), helium (He), and nitrogen ($N_2$) as a sputtering gas at an electric power of an RF power supply that was set to a predetermined value.

Next, the transparent substrate 1 on which the light shielding film 2 was formed was subjected to a heating treatment under conditions of a heating temperature of 500° C. and treatment time of 1 hour in air to adjust stress of the film.

An optical density (OD) of the light shielding film 2 obtained after the heating treatment was measured at a wavelength of 193 nm by using a spectrophotometer (Cary4000 manufactured by Agilent Technologies), and a value of the OD was 3.00. According to the result, a mask blank in Example 1 has high light shielding performance.

A phase difference of the light shielding film 2 obtained after the heating treatment was measured at a wavelength of 193 nm by using a phase shift measurement system (MPM-193 manufactured by Lasertec Corporation), and a value of the phase difference was 75.2°.

A surface reflectance and a back surface reflectance of the light shielding film 2 obtained after the heating treatment were measured at a wavelength of 193 nm by using a spectrophotometer (U-4100 manufactured by Hitachi, Ltd.), and values of the surface reflectance and the back surface reflectance were 37.1% and 30.0%, respectively. According to the results, a transfer mask manufactured by using the mask blank in Example 1 can suppress deterioration of a projected optical image during transfer by exposure.

A refractive index n and an extinction coefficient k of the light shielding film 2 obtained after the heating treatment were measured at a wavelength of 193 nm by a spectroscopic ellipsometer (M-2000D manufactured by J. A. Woollam Co., Inc.). The refractive index n at a wavelength of 193 nm was 1.83 and the extinction coefficient k at a wavelength of 193 nm was 1.79. From these values of the refractive index n and the extinction coefficient k, the refractive index n and the extinction coefficient k of the light shielding film 2 satisfy the conditions of Formulas (4), (6), (8), and (10) described above, and are matched with the values of the film thickness, the optical density, the phase difference, the surface reflectance, and the back surface reflectance described above. Note that since the refractive index n and the extinction coefficient k of the light shielding film 2 satisfy the conditions of Formulas (4), (8), and (10) described above, the refractive index n and the extinction coefficient k also satisfy the conditions of Formulas (1), (2), and (3) described above.

Next, the light shielding film 2 in Example 1 was subjected to an optical simulation for calculating EMF bias. In this optical simulation, the refractive index n, the extinction coefficient k, and the film thickness d of the light shielding film 2 obtained by the measurement described above were used as input values. Furthermore, as a design pattern applied to the optical simulation, a line and space pattern of a DRAM half-pitch (hp) of 40 nm was used. A dipolar illumination was set as an illumination condition of exposure light applied to the optical simulation. EMF bias was calculated as a difference between bias (correction amount) calculated by an optical simulation using TMA and bias (correction amount) calculated by a simulation in consideration of an EMF effect. As a result, the EMF bias was 0.5 nm. From this result, it can be confirmed that in the mask blank in Example 1, the EMF bias is sufficiently reduced. Further, it can be confirmed that a load applied to correction calculation of a design pattern used when a transfer mask is manufactured from the mask blank in Example 1 is reduced, and complication of a pattern actually formed in the light shielding film 2 can also be suppressed.

Next, the transparent substrate 1 on which the light shielding film 2 obtained after the heating treatment was formed was installed in a single-wafer DC sputtering device and a hard mask film 3 including a CrN film having a film thickness of 5 nm was formed by reactive sputtering (DC sputtering) using a chromium (Cr) target in an atmosphere of a mixed gas of argon (Ar) and nitrogen ($N_2$). A film composition ratio of this film was measured by XPS, and had Cr of 75 atom % and N of 25 atom %. Then, a heat treatment was performed at a temperature (280° C.) lower than the temperature in the heating treatment performed on the light shielding film 2 and stress of the hard mask film 3 was adjusted.

A mask blank 100 including a structure in which the light shielding film 2 and the hard mask film 3 were stacked on the transparent substrate 1 was manufactured by the above-described procedure.

Manufacture of Transfer Mask

Next, a transfer mask (binary mask) 200 in Example 1 was manufactured by the following procedure with use of the mask blank 100 in Example 1.

First, the mask blank 100 in Example 1 (see FIG. 4A) was prepared. A resist film including a chemically amplified resist for electron beam lithography and having a film thickness of 80 nm was formed in contact with a surface of the hard mask film 3. Next, a transfer pattern to be formed in the light shielding film 2 was written with an electron beam in the resist film and a predetermined development treatment and a predetermined washing treatment were performed to form a resist pattern 4a (see FIG. 4B).

Next, dry etching using a mixed gas of chlorine and oxygen (gas flow rate ratio $Cl_2:O_2=4:1$) was performed by using the resist pattern 4a as a mask, to form a pattern (hard mask pattern 3a) in the hard mask film 3 (see FIG. 4C).

Next, the resist pattern 4a was removed (see FIG. 4D). Subsequently, dry etching using a fluorine-based gas (mixed gas of $SF_6$ and He) was performed by using the hard mask pattern 3a as a mask, to form a pattern (light shielding film pattern 2a) in the light shielding film 2 (see FIG. 4E).

Subsequently, the hard mask pattern 3a was removed by using a chromium etching liquid containing diammonium cerium nitrate and perchloric acid, and was subjected to a predetermined treatment such as washing to obtain the transfer mask 200 (see FIG. 4F).

The transfer mask 200 in Example 1 was set on a mask stage of an exposure apparatus, and a resist film on a semiconductor device was subjected to transfer by exposure. As a result, a transfer pattern was transferred to the resist film on the semiconductor device with high CD precision.

Example 2

Manufacture of Mask Blank

A mask blank in Example 2 was manufactured by the same procedure as the procedure for the mask blank 100 in Example 1 except that a light shielding film was formed as follows.

A method of forming a light shielding film in Example 2 is as follows.

A transparent substrate 1 was installed in a single-wafer DC sputtering apparatus. A light shielding film 2 consisting of silicon and nitrogen and having a thickness of 45.7 nm was formed on the transparent substrate 1 by reactive sputtering (DC sputtering) using a silicon (Si) target and using a mixed gas of krypton (Kr), helium (He), and nitrogen ($N_2$) as a sputtering gas at an electric power of a DC power supply that was set to a predetermined value.

Next, the transparent substrate 1 on which the light shielding film 2 was formed was subjected to a heating treatment under conditions of a heating temperature of 500° C. and treatment time of 1 hour in air to adjust stress of the film.

An optical density (OD) of the light shielding film 2 obtained after the heating treatment was measured in the same manner as in Example 1, and a value of the OD was 3.06. According to the result, the mask blank in Example 2 has high light shielding performance. Furthermore, a phase difference of the light shielding film 2 obtained after the heating treatment was measured in the same manner as in Example 1, but a value of the phase difference was not measurable. Then, an optical simulation was performed based on a refractive index n and an extinction coefficient k of the light shielding film 2 obtained after the heating treatment, and the phase difference was determined. A value of the phase difference was −11.7°. Furthermore, a surface reflectance and a back surface reflectance of the light shielding film 2 obtained after the heating treatment were measured in the same manner as in Example 1, and values of the surface reflectance and the back surface reflectance were 54.3% and 52.1%, respectively. Furthermore, the refractive index n and the extinction coefficient k of the light shielding film 2 obtained after the heating treatment were measured in the same manner as in Example 1, and the refractive index was 1.16, and the extinction coefficient k was 2.40. From these values of the refractive index n and the extinction coefficient k, the refractive index n and the extinction coefficient k of the light shielding film 2 obtained after the heating treatment satisfy the conditions of Formulas (4), (5), and (8), and are matched with the values of the film thickness, the optical density, the phase difference, the surface reflectance, and the back surface reflectance described above. Note that since the refractive index n and the extinction coefficient k of the light shielding film 2 satisfy the conditions of Formulas (4) and (8), the refractive index n and the extinction coefficient k also satisfy the conditions of Formulas (1) and (2) described above.

EMF bias of the light shielding film 2 was measured in the same manner as in Example 1, and the EMF bias was 3.6 nm. From this result, it can be confirmed that in the mask blank in Example 2, the EMF bias can be reduced sufficiently. Further, it can be confirmed that a load related to calculation of correction of a design pattern performed when a transfer mask is manufactured from the mask blank in Example 2 is reduced, and complication of a pattern actually formed in the light shielding film 2 can also be suppressed.

Manufacture of Transfer Mask

Next, a transfer mask (binary mask) in Example 2 was manufactured by the same procedure as in Example 1 with use of the mask blank in Example 2. The transfer mask 200 in Example 2 was set on a mask stage of an exposure apparatus, and a resist film on a semiconductor device was subjected to transfer by exposure. As a result, a transfer pattern was transferred to the resist film on the semiconductor device with high CD precision.

Comparative Example 1

Manufacture of Mask Blank

A mask blank in Comparative Example 1 was manufactured by the same procedure as the procedure for the mask blank 100 in Example 1 except that a light shielding film was formed as follows.

A method of forming a light shielding film in Comparative Example 1 is as follows. A transparent substrate 1 was installed in a single-wafer RF sputtering apparatus. A light shielding film consisting of silicon and nitrogen and having a thickness of 69.5 nm was formed on the transparent substrate 1 by reactive sputtering (RF sputtering) using a silicon (Si) target and using a mixed gas of krypton (Kr), helium (He), and nitrogen ($N_2$) as a sputtering gas at an electric power of an RF power supply that was set to a predetermined value.

Next, the transparent substrate 1 on which the light shielding film was formed was subjected to a heating treatment under conditions of a heating temperature of 500° C. and treatment time of 1 hour in air to adjust stress of the film.

An optical density (OD) of the light shielding film obtained after the heating treatment was measured in the same manner as in Example 1, and a value of the OD was 3.01. According to the results, the mask blank in Comparative Example 1 has sufficient light shielding performance. Furthermore, a phase difference of the light shielding film obtained after the heating treatment was measured in the same manner as in Example 1, but a value of the phase difference was not measurable. Then, a simulation was performed based on a refractive index n and an extinction coefficient k of the light shielding film obtained after the heating treatment to determine the phase difference, and a value of the phase difference was 129.9°. Furthermore, a surface reflectance and a back surface reflectance of the light shielding film obtained after the heating treatment were measured in the same manner as in Example 1, and values of the surface reflectance and the back surface reflectance were 29.4% and 19.6%, respectively. Furthermore, the refractive index n and the extinction coefficient k of the light shielding film 2 obtained after the heating treatment were measured in the same manner as in Example 1, and the refractive index n was 2.10, and the extinction coefficient k was 1.51. From these values of the refractive index n and the extinction coefficient k, the refractive index n and the extinction coefficient k of the light shielding film obtained after the heating treatment satisfy Formulas (7) and (10) but do not satisfy the condition of Formula (1), and are matched with the values of the film thickness, the optical density, the phase difference, the surface reflectance, and the back surface reflectance described above. Note that since the refractive index n and the extinction coefficient k of the light shielding film satisfy Formulas (7) and (10), the refractive index n and the extinction coefficient k also satisfy Formulas (2) and (3) described above, but do not satisfy Formula (1).

EMF bias of the light shielding film was measured in the same manner as in Example 1, and the EMF bias was 8.2 nm. From this result, it can be confirmed that in the mask blank in Comparative Example 1, the EMF bias cannot be sufficiently reduced. Further, it can be confirmed that a load related to correction calculation of a design pattern performed when a transfer mask is manufactured from the mask blank in Comparative Example 1 is excessively large, and a pattern actually formed in the light shielding film 2 is complicated.

Manufacture of Transfer Mask

Next, a transfer mask (binary mask) in Comparative Example 1 was manufactured by the same procedure as in Example 1 with use of the mask blank in Comparative Example 1. The transfer mask in Comparative Example 1 was set on a mask stage of an exposure apparatus, and a resist film on a semiconductor device was subjected to transfer by exposure. As a result, CD dispersion of a transfer pattern formed in the resist film on the semiconductor device was large.

DESCRIPTION OF REFERENCE NUMERALS

1 Transparent substrate
2 Light shielding film
2a Light shielding film pattern
3 Hard mask film
3a Hard mask pattern
4a Resist pattern
100 Mask blank
200 Transfer mask (binary mask)

The invention claimed is:

1. A mask blank comprising a light shielding film on a transparent substrate,
    wherein the light shielding film is a single layer film formed of a material consisting of silicon and nitrogen or a material consisting of silicon, nitrogen, and one or more elements selected from semimetal elements and non-metal elements,
    the light shielding film has an optical density of 3.0 or greater to exposure light of an ArF excimer laser,
    and a refractive index n and an extinction coefficient k of the light shielding film to the exposure light simultaneously satisfy relationships defined by Formulas (1) and (2):

$$n \leq 0.0733 \times k^2 + 0.4069 \times k + 1.0083 \quad \text{Formula (1)}$$

$$n \geq 29.316 \times k^2 - 92.292 \times k + 72.671 \quad \text{Formula (2)}.$$

2. The mask blank according to claim 1, wherein the light shielding film has the extinction coefficient k of 2.6 or less.

3. The mask blank according to claim 1, wherein the light shielding film has the refractive index n of 0.8 or greater.

4. The mask blank according to claim 1, wherein the refractive index n and the extinction coefficient k of the light shielding film further satisfy a relationship defined by Formula (3):

$$n \geq 0.7929 \times k^2 - 2.1606 \times k + 2.1448 \quad \text{Formula (3)}.$$

5. The mask blank according to claim 1, wherein dispersion of nitrogen content in a thickness direction at a region except for a surface layer on a side of the transparent substrate and a surface layer on a side opposite to the transparent substrate in the light shielding film is 5 atom % or less.

6. The mask blank according to claim 1, comprising a hard mask film formed of a material containing chromium on the light shielding film.

7. The mask blank according to claim 2, wherein the refractive index of the light shielding film is 0.8 or greater.

8. The mask blank according to claim 7, wherein dispersion of nitrogen content in a thickness direction at a region except for a surface layer on a side of the transparent substrate and a surface layer on a side opposite to the transparent substrate in the light shielding film is 5 atom % or less.

9. The mask blank according to claim 2, wherein dispersion of nitrogen content in a thickness direction at a region except for a surface layer on a side of the transparent substrate and a surface layer on a side opposite to the transparent substrate in the light shielding film is 5 atom % or less.

10. The mask blank according to claim 2, comprising a hard mask film formed of a material containing chromium on the light shielding film.

11. A transfer mask comprising a light shielding film including a transfer pattern on a transparent substrate,
    wherein the light shielding film is a single layer film formed of a material consisting of silicon and nitrogen or a material consisting of silicon, nitrogen, and one or more elements selected from semimetal elements and non-metal elements,
    the light shielding film has an optical density of 3.0 or greater to exposure light of an ArF excimer laser, and
    a refractive index n and an extinction coefficient k of the light shielding film to the exposure light simultaneously satisfy relationships defined by Formulas (1) and (2):

$$n \leq 0.0733 \times k^2 + 0.4069 \times k + 1.0083 \quad \text{Formula (1)}$$

$$n \geq 29.316 \times k^2 - 92.292 \times k + 72.671 \quad \text{Formula (2)}.$$

12. The transfer mask according to claim 11, wherein the light shielding film has the extinction coefficient k of 2.6 or less.

13. The transfer mask according to claim 11, wherein the light shielding film has the refractive index n of 0.8 or greater.

14. The transfer mask according to claim 11, wherein the refractive index n and the extinction coefficient k of the light shielding film further satisfy a relationship defined by Formula (3):

$$n \geq 0.7929 \times k^2 - 2.1606 \times k + 2.1448 \quad \text{Formula (3)}.$$

15. The transfer mask according to claim 11, wherein dispersion of nitrogen content in a thickness direction at a region except for a surface layer on a side of the transparent substrate and a surface layer on a side opposite to the transparent substrate in the light shielding film is 5 atom % or less.

16. A method of manufacturing a semiconductor device, the method comprising the step of transferring by exposure a transfer pattern to a resist film on a semiconductor substrate by using the transfer mask according to claim 11.

17. The transfer mask according to claim 12, wherein the refractive index of the light shielding film is 0.8 or greater.

18. The transfer mask according to claim 17, wherein dispersion of nitrogen content in a thickness direction at a region except for a surface layer on a side of the transparent substrate and a surface layer on a side opposite to the transparent substrate in the light shielding film is 5 atom % or less.

19. The transfer mask according to claim 12, wherein dispersion of nitrogen content in a thickness direction at a region except for a surface layer on a side of the transparent substrate and a surface layer on a side opposite to the transparent substrate in the light shielding film is 5 atom % or less.

20. The transfer mask according to claim 12, comprising a hard mask film formed of a material containing chromium on the light shielding film.

* * * * *